(12) United States Patent
Tsunashima

(10) Patent No.: US 12,027,534 B2
(45) Date of Patent: Jul. 2, 2024

(54) SEMICONDUCTOR DEVICE

(71) Applicant: Japan Display Inc., Tokyo (JP)

(72) Inventor: Takanori Tsunashima, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 83 days.

(21) Appl. No.: 17/840,621

(22) Filed: Jun. 15, 2022

(65) Prior Publication Data

US 2022/0310667 A1  Sep. 29, 2022

Related U.S. Application Data

(63) Continuation of application No. 17/120,317, filed on Dec. 14, 2020, now Pat. No. 11,393,852, which is a continuation of application No. PCT/JP2019/018149, filed on Apr. 26, 2019.

(30) Foreign Application Priority Data

Jun. 14, 2018 (JP) .................................. 2018-113522

(51) Int. Cl.
H01L 27/12 (2006.01)
H01L 27/02 (2006.01)

(52) U.S. Cl.
CPC ...... H01L 27/1244 (2013.01); H01L 27/0292 (2013.01)

(58) Field of Classification Search
None
See application file for complete search history.

(56) References Cited

U.S. PATENT DOCUMENTS

| 2001/0024187 A1 | 9/2001 | Sato et al. |
| 2005/0019203 A1 | 1/2005 | Saitoh et al. |
| 2012/0081499 A1 | 4/2012 | Tsunashima et al. |
| 2013/0208207 A1 | 8/2013 | Okamoto et al. |
| 2016/0238902 A1 | 8/2016 | Kawasaki et al. |
| 2017/0170206 A1* | 6/2017 | Lee ..................... H01L 27/1218 |
| 2018/0123060 A1 | 5/2018 | Jang et al. |
| 2018/0261657 A1 | 9/2018 | Kim et al. |

(Continued)

FOREIGN PATENT DOCUMENTS

| CN | 106887447 A | 6/2017 |
| JP | 2017-187581 A | 10/2017 |

OTHER PUBLICATIONS

International Search Report and Written Opinion dated Jul. 2, 2019, received for PCT Application No. PCT/JP2019/018149, Filed on Apr. 26, 2019, 8 pages.

*Primary Examiner* — Steven M Christopher
(74) *Attorney, Agent, or Firm* — XSENSUS LLP

(57) ABSTRACT

According to one embodiment, a semiconductor device including, a panel including an inorganic film, and a first pad and a second pad positioned on the inorganic film, and a line substrate including a first connection line electrically connected to the first pad, and a second connection line electrically connected to the second pad, the line substrate positioned on the panel, wherein the inorganic film includes a first cut portion overlapping the first connection line, a second cut portion overlapping the second connection line, and a first extension portion between the first cut portion and the second cut portion, and the first cut portion, the second cut portion, and the first extension portion extend to a first side of the panel.

8 Claims, 9 Drawing Sheets

(56) References Cited

U.S. PATENT DOCUMENTS

| | | |
|---|---|---|
| 2019/0293980 A1 | 9/2019 | Inoue et al. |
| 2020/0058678 A1* | 2/2020 | Ueda .................. H01L 29/45 |
| 2020/0112106 A1 | 4/2020 | Misaki |

* cited by examiner

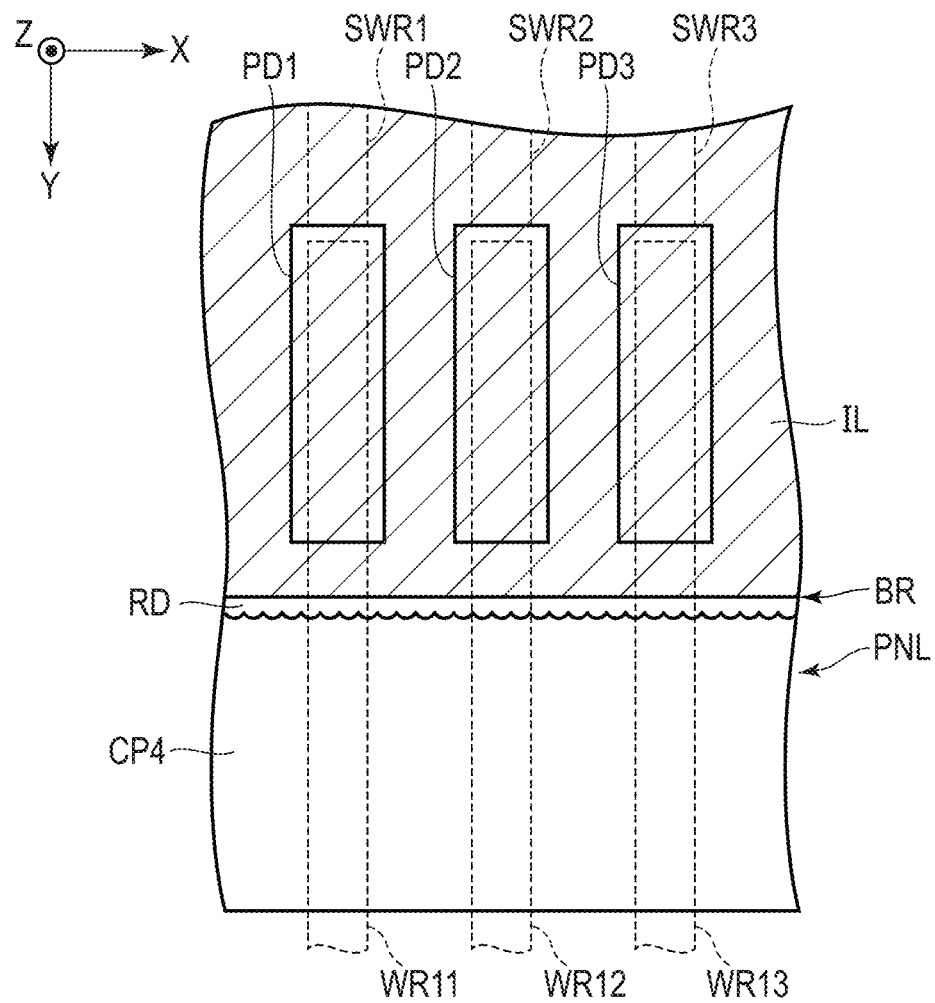
F I G. 5

SEMICONDUCTOR DEVICE

CROSS-REFERENCE TO RELATED APPLICATIONS

This application is a continuation of U.S. application Ser. No. 17/120,317, filed Dec. 14, 2020, which is a Continuation Application of PCT Application No. PCT/JP2019/018149, filed Apr. 26, 2019 and based upon and claiming the benefit of priority from Japanese Patent Application No. 2018-113522, filed Jun. 14, 2018, the entire contents of all of which are incorporated herein by reference.

FIELD

Embodiments described herein relate generally to a semiconductor device.

BACKGROUND

Display devices such as a liquid crystal display device and an organic electroluminescence display device are used in various fields. In recent years, flexible display devices which are formed flexible by using a flexible substrate have been developed. When bending such a flexible display device, there may be a crack in an organic film therein, for example. In order to prevent the crack on the inorganic film from proceeding to lines to break them, there is a technique in development of covering the lines with an organic film from above and below.

BRIEF DESCRIPTION OF THE DRAWINGS

FIG. 5 is a pan view illustrating a comparative example of the embodiment.

DETAILED DESCRIPTION

In general, according to one embodiment, a semiconductor device comprising: a panel including an inorganic film, and a first pad and a second pad positioned on the inorganic film; and a line substrate including a first connection line electrically connected to the first pad, and a second connection line electrically connected to the second pad, the line substrate positioned on the panel, wherein the inorganic film includes a first cut portion overlapping the first connection line, a second cut portion overlapping the second connection line, and a first extension portion between the first cut portion and the second cut portion, and the first cut portion, the second cut portion, and the first extension portion extend to a first side of the panel.

Embodiments will be explained hereinafter with reference to the accompanying drawings. Note that the disclosure is merely an example, and any embodiment which is conceivable by a person having an ordinary skill in the art within the spirit of the invention is encompassed by a range of the present invention. Furthermore, for better understanding of the explanation, figures may be drawn more schematically as to dimensions of each element as compared to an actual embodiment, and they are merely for clarification. Such schematic illustration does not limit the interpretation of the present invention. In each figure, some of same or similar elements arranged continuously may not be denoted, and the reference numbers may be omitted. Furthermore, in the description and each figure, structural elements which are functionally the same or similar to those have been explained already will be referred to by the same reference numbers and the explanation considered to be redundant will be omitted.

The main structure of the present embodiment can be applied to a flexible display device and a finger print sensor, for example. In the present application, the structure of the embodiment will be explained as applied to a display device. The display device can be applied to various devices such as a smartphone, tablet, mobile phone, clamshell personal computer, in-car device, and gaming device. Furthermore, the embodiment can be applied to various display devices such as a liquid crystal display device, self-luminance display device such as an organic electroluminescence display device, electron paper display device including an electrophoretic element or the like, micro-electromechanical system (MEMS)-applied display device, and electrochromism-applied display device.

Figure 1:
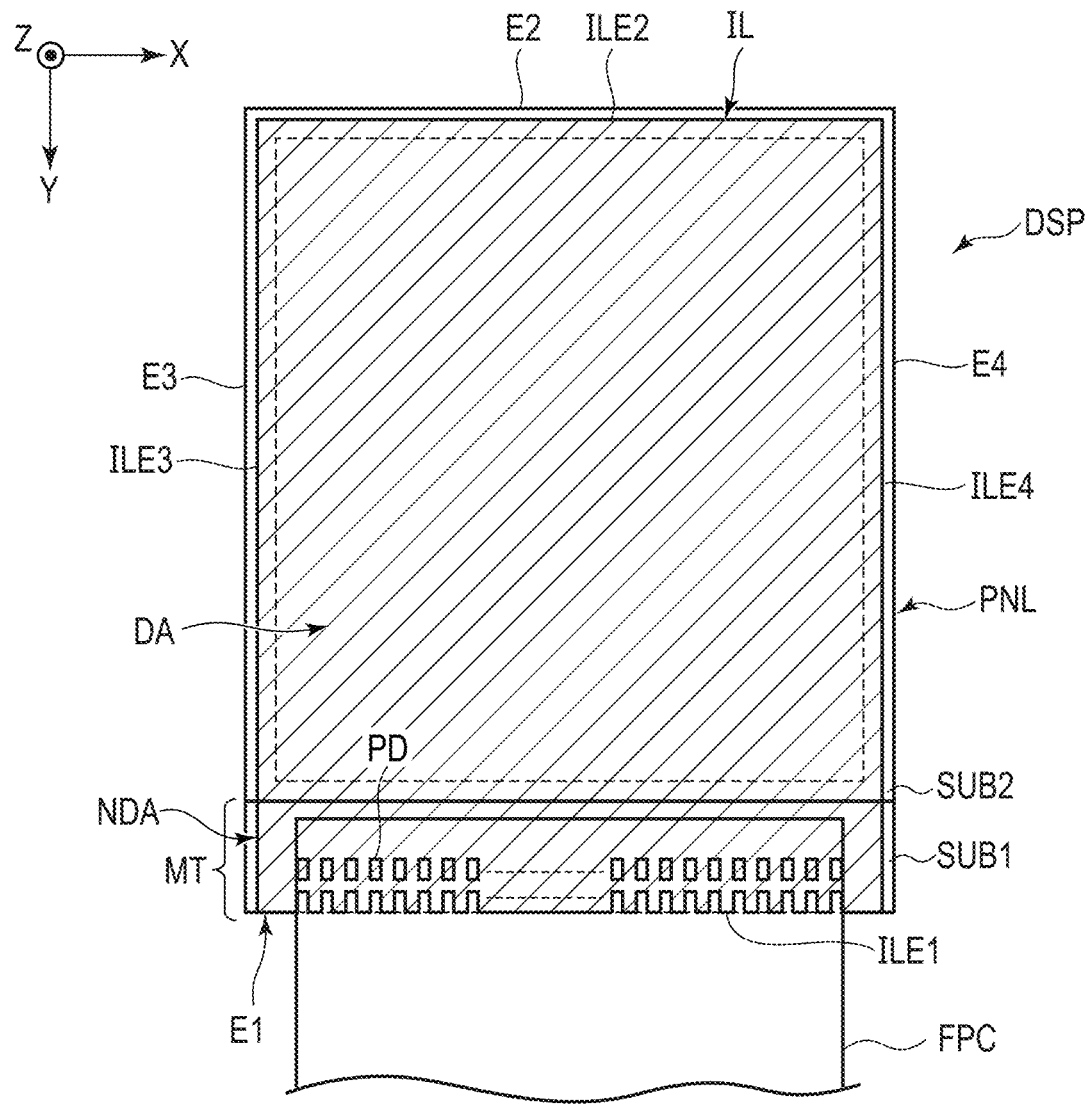
FIG. 1 is a plan view of the structure of a display device of an embodiment.

FIG. 1 is a plan view illustrating the structure of a display device DSP of the embodiment.

Note that a first direction X, second direction Y, and third direction Z in the figure are orthogonal to each other; however, they may cross each other at an angle other than 90 degrees. The first direction X and the second direction Y correspond to directions parallel to the main surface of the substrates of the display device DSP, and the third direction Z corresponds to a thickness direction of the display device DSP.

In the following description, the direction toward the tip of arrow indicative of the third direction Z will be defined as above, and the opposite direction thereof will be defined as below. Phrases such as "second member above first member" and "second member below first member" will be interpreted as the second member contacting the first member or the second member apart from the first member. Furthermore, seeing an X-Y plane defined by the first direction X and the second direction Y from the tip side of the arrow indicating the third direction Z will be defined as a plan view.

The display device DSP includes a display panel PNL and a flexible printed circuit FPC. The display panel PNL includes a first substrate SUB1 and a second substrate SUB2. The first substrate SUB1 and the second substrate SUB2 are opposed to the third direction Z. Furthermore, the display panel PNL includes display area DA to display an image and a frame-like non-display area NOA surrounding the display area DA.

The first substrate SUB1 includes a pad PD and an inorganic film IL. Furthermore, the first substrate SUB1 includes a mount MT outside the area overlapping the second substrate SUB2. The pad PD is positioned in the mount MT.

The inorganic film IL is hatched in FIG. 1. The inorganic film IL includes a first end ILE1 and a second end ILE2 extending in the first direction X, and a third end ILE3 and a fourth end ILE4 extending in the second direction Y. The first end ILE1 is formed in a comb-like shape. Furthermore, the display panel PNL includes a first side E1 and a second side E2 extending in the first direction X, and a third side E3 and a fourth side E4 extending in the second direction Y. The second end ILE2 is positioned closer to the first side E1 than is the second side E2, the third end ILE3 is positioned closer to the fourth side E4 than is the third side E3, and the fourth end ILE4 is positioned closer to the third side E3 than is the fourth side E4. The display panel PNL is cut to individual panels from a large-scale panel by laser trimming or dicing in the manufacturing process. At that time, if the inorganic film IL is positioned on a cut line, there may be a crack formed on the inorganic film IL. Furthermore, the crack may reach the display area DA. Thus, the inorganic film IL should be formed avoiding a cutline. Note that, in the example of FIG. 1, the cut line of the display panel PNL corresponds to the first side E1, second side E2, third side E3, and fourth side E4. Furthermore, in the example depicted, the inorganic film IL is not positioned to overlap the second side E2, third side E3, or fourth side E4.

The flexible printed circuit FPC is positioned above the display panel PNL, and is electrically connected to the display panel PNL. The flexible printed circuit FPC is mounted on the mount MT and overlaps the first side E1. Furthermore, in the example depicted, the width of the flexible printed circuit FPC along the first direction X is less than the width of the display panel PNL along the first direction X. The flexible printed circuit FPC is a flexible substrate, for example.

Figure 2:
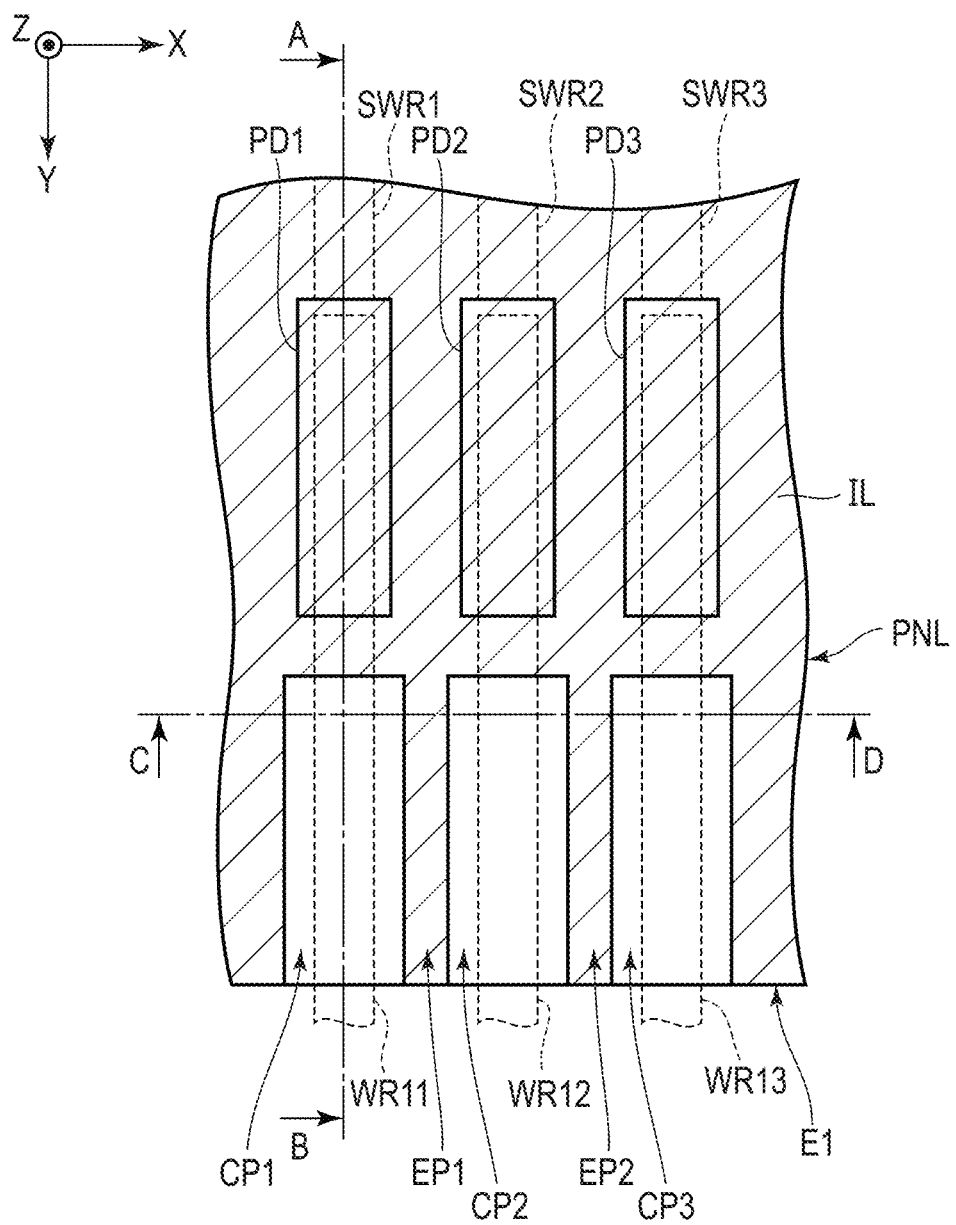
FIG. 2 is a plan view illustrating the periphery of a first side of a display panel of FIG. 1.

FIG. 2 is a plan view of the periphery of the first side E1 of the display panel PNL in FIG. 1.

A first pad PD1, second pad PD2, and third pad PD3 are positioned above the inorganic film IL. The first pad PD1, second pad PD2, and third pad PD3 are arranged in the first direction X in this order. Furthermore, the display panel PNL includes a signal line SWR1 connected to the first pad PD1, signal line SWR2 connected to the second pad PD2, and signal line SWR3 connected to the third pad PD3. The flexible printed circuit FPC of FIG. 1 includes a first connection line WR11 electrically connected to the first pad PD1, second connection line WR12 electrically connected to the second pad PD2, and third connection line WR13 electrically connected to the third pad PD3.

The inorganic film IL includes a first cut portion CP1, second cut portion CP2, and third cut portion CP3, and first extension portion EP1 between the first cut portion CP1 and the second cut portion CP2, and second extension portion EP2 between the second cut portion CP2 and the third cut portion CP3. The first cut portion CP1, second cut portion CP2, and third cut portion CP3 are arranged in the first direction X. The first cut portion CP1 is parallel to the first pad PD1 in the second direction Y, second cut portion CP2 is parallel to the second pad PD2 in the second direction Y, and third cut portion CP3 is parallel to the third pad PD3 in the second direction Y. Furthermore, the first cut portion CP1 overlaps the first connection line WR11, second cut portion CP2 overlaps the second connection line WR12, and third cut portion CP3 overlaps the third connection line WR13. That is, the first extension portion EP1 is positioned between the first connection line WR11 and the second connection line WR12 in a plan view, second extension portion EP2 is positioned between the second connection line WR12 and the third connection line WR13 in a plan view. The first cut portion CP1, second cut portion CP2, third cut portion CP3, first extension portion EP1, and second extension portion EP2 extend to a first side E1 of the display panel PNL.

Figure 3:
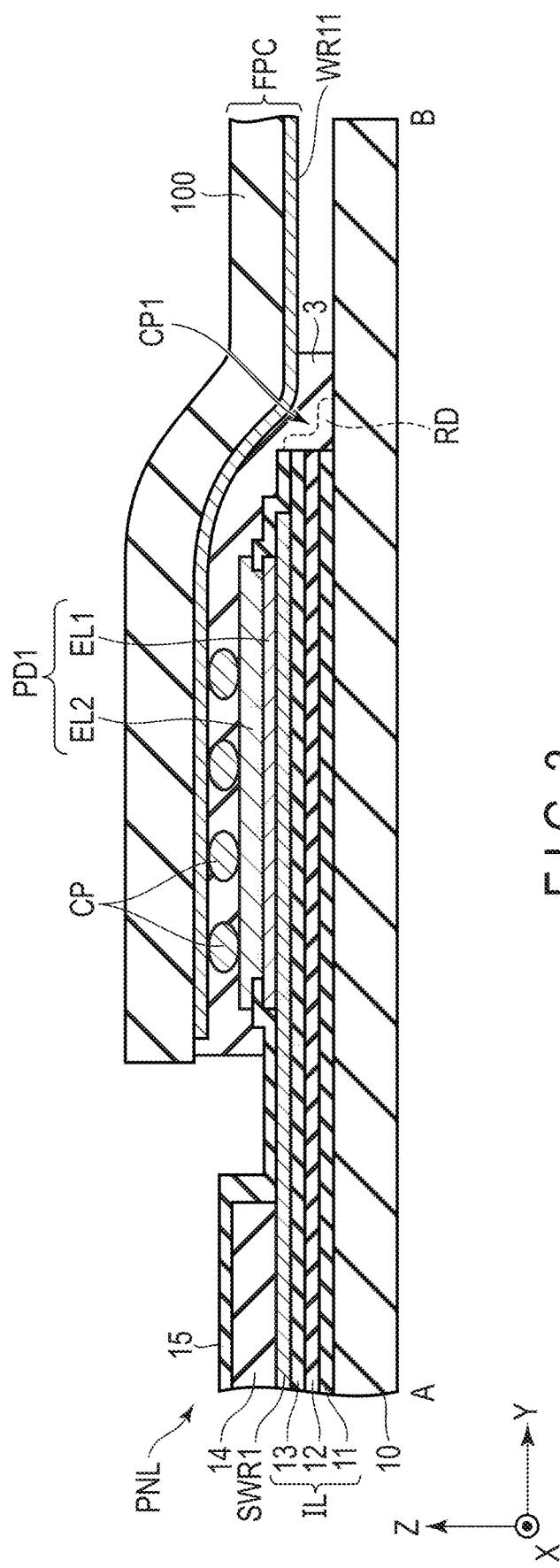
FIG. 3 is a cross-sectional view of the display panel, taken along line A-B of FIG. 2.

FIG. 3 is a cross-sectional view of the display panel PNL, taken along line A-B of FIG. 2.

The display panel PNL includes an insulating substrate 10, inorganic film IL, signal line SWR1, insulating film 14, insulating film 15, and first pad PD1.

The insulating substrate 10 is, for example, a flexible resin substrate, and is formed of polyimide or the like. The inorganic film IL is positioned above the insulating substrate 10. The inorganic film IL includes an insulating film 11 layered on the insulating substrate 10, insulating film 12 layered on the insulating film 11, and insulating film 13 layered on the insulating film 12. The signal line SWR1 is positioned above the inorganic film IL. The insulating film 14 is positioned above the signal line SWR1.

The first pad PD1 is positioned above the signal line SWR1. The first pad PD1 includes a first transparent electrode EL1 and a second transparent electrode EL2 arranged above the first transparent electrode EL1. The first transparent electrode EL1 contacts the signal line SWR1. The first transparent electrode EL1 and the second transparent electrode EL2 are formed of a transparent conductive material such as indium tin oxide (ITO) or indium zinc oxide (IZO). The insulating film 15 covers the insulating film 14, and contacts the signal line SWR1, first pad PD1, and inorganic film IL. The insulating film 15 is interposed between the first transparent electrode EL1 and the second transparent electrode EL2 in a part of the first pad PD1.

The insulating film 11, insulating film 12, insulating film 13, and insulating film 15 are an inorganic insulating film formed of an inorganic insulating material such as silicon oxide, silicon nitride, and silicon oxynitride, and may have a single layer structure or a multilayered structure. The insulating film 14 is, for example, an organic insulating film formed of an organic insulating material such as acrylic resin.

The flexible printed circuit FPC includes a base substrate 100 and the first connection line WR11. The first connection line WR11 is positioned below the base substrate 100.

The display panel PNL and the flexible printed circuit FPC are electrically connected to each other and adhered to each other via an anisotropic conductive film 3 which is a conductive material. The anisotropic conductive film 3 includes conductive particles CP scattered in the adhesive agent. Thus, the flexible printed circuit FPC and the display panel PNL are electrically and physically connected together by pressing and heating the flexible printed circuit FPC and the display panel PNL from above and below in the third direction Z with the anisotropic conductive film 3 interposed therebetween. The anisotropic conductive film 3 is electrically connected to the first pad PD1. Furthermore, the anisotropic conductive film 3 contacts the first connection line WR11 to be electrically connected thereto. Furthermore, since the conductive particles CP are crushed between the first pad PD1 and the first connection line WR11, the diameter in the second direction Y is greater than the diameter in the third direction Z.

In the first cut portion CP1 of the inorganic film IL, a residue RD may reside because of a step of the inorganic film IL in the manufacturing process. The residue RD is a conductive material which has not been removed in the formation of a conducive layer such as first signal line SWR1 or first pad PD1. For example, the inorganic film IL is subjected to the patterning as a whole after the formation of the insulating films 11 to 13. Thus, when the patterning of the inorganic film IL is performed before forming the first signal line SWR1, the residue RD includes the material of the first signal line SWR1 and the material of the first pad PD1. Furthermore, when the patterning of the inorganic film IL is performed after forming the first signal line SWR1, the residue RD includes the material of the first pad PD1. The residue RD may conduct with the first connection line WR11 of the flexible printed circuit FPC. The residue RD and the first connection line WR11 may be conductive via the anisotropic conductive film 3, or may be conductive by directly contacting with each other.

Figure 4:
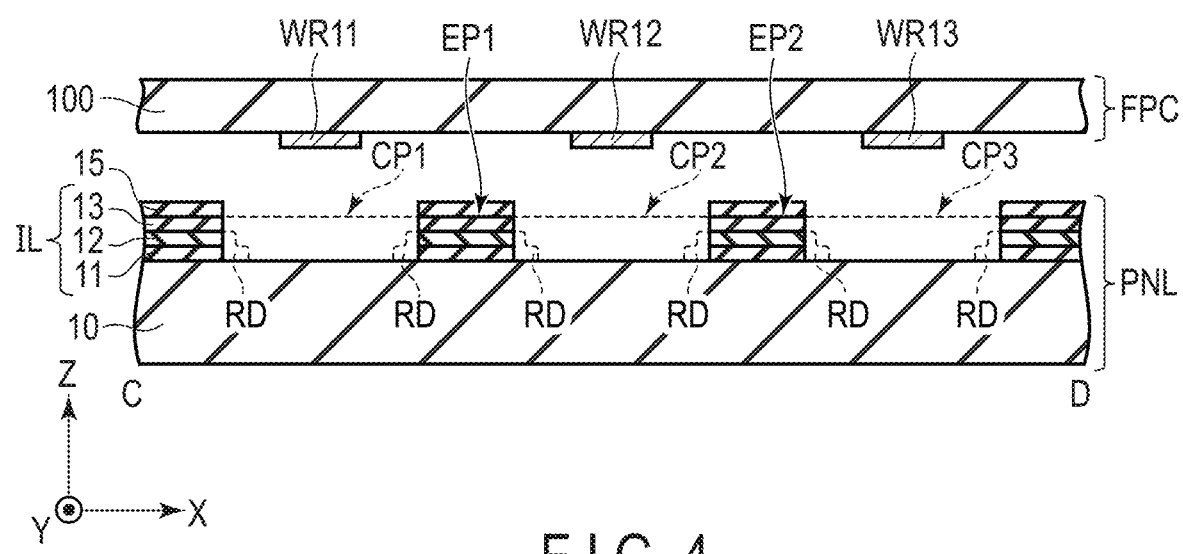
FIG. 4 is a cross-sectional view of the display panel, taken along line C-D of FIG. 2.

FIG. 4 is a cross-sectional view of the display panel PNL, taken along line C-D of FIG. 2.

The first cut portion CP1, second cut portion CP2, and third cut portion CP3 passes through to the insulating substrate 10. The residue RD may reside a step between the inorganic film IL and the insulating substrate 10, but does not reside on the inorganic film IL. The insulating film 15 may be arranged above the first extension portion EP1 and the second extension portion EP2.

FIG. 5 is a plan view illustrating a comparative example with respect to the embodiment. The structure of FIG. 5 has a different structure than that of the inorganic film IL of FIG. 2.

The inorganic film IL includes a fourth cut portion CP4. The fourth cut portion CP4 extends over the position overlapping the first connection line WR11, second connection line WR12, and third connection line WR13. In the example depicted, the residue RD resides in a border part BR of the fourth cut portion CP4. The residue RD extends along the border part BR of the fourth cut portion CP4 in the first direction X.

For example, the residue RD may be connected with the first connection line WR11, second connection line WR12, and third connection line WR13. Furthermore, the residue RD extends in the first direction X between the first connection line WR11, second connection line WR12, and third connection line WR13, and thus, the first connection line WR11, second connection line WR12, and third connection line WR13 may be conductive with each other.

In the present embodiment, the inorganic film IL includes the first extension portion EP1 and the second extension portion EP2 as in FIG. 2. In the position overlapping the first extension portion EP1 and the second extension portion EP2, the residue RD does not reside. Thus, undesirable connection between the first connection line WR11 and the second connection line WR12, or between the second connection line WR2 and the third connection line WR13 by the residue RD can be suppressed. Thus, decrease of production yield can be suppressed.

Furthermore, with the first cut portion CP1, second cut portion CP2, and third cut portion CP3, the inorganic film IL overlapping the first side E1 of the display panel PNL can be reduced. Thus, when the cutting over the first side E1 is performed, even if there is a crack in the first extension portion EP1 and the second extension portion EP2, the shape of the first extension portion EP1 and the second extension portion EP2 is slender, the crack reaching to the display area DA side can be suppressed.

Figure 6:
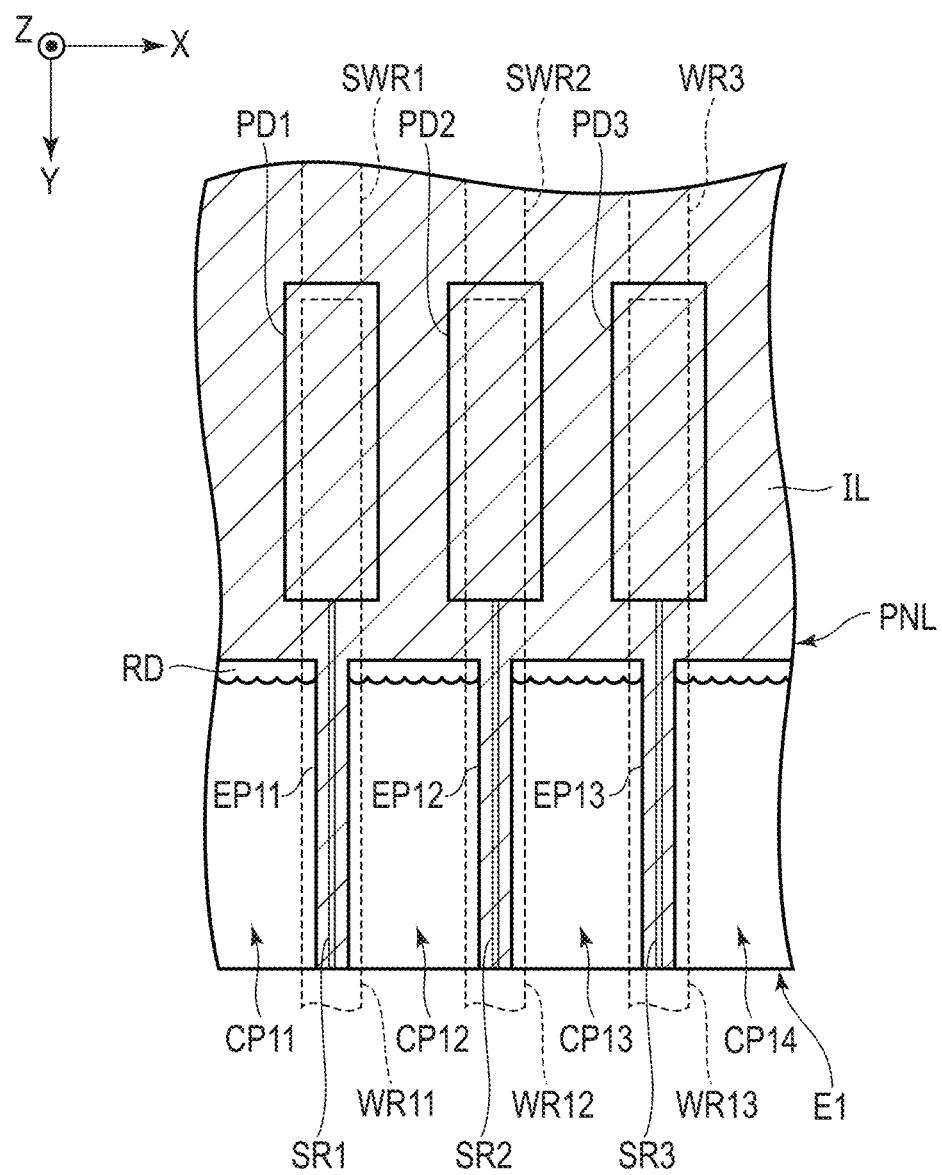
FIG. 6 is a cross-sectional view of the comparative example with respect to a variation of the embodiment.

FIG. 6 is a cross-sectional view of the comparative example with respect to a variation of the embodiment. In the structure of FIG. 6, the display panel PNL includes a first short ring line SR1, second short ring line SR2, and third short ring line SR3, as compared to the structure of FIG. 5.

The first short ring line SR1 is connected to the first pad PD1, second short ring line SR2 is connected to the second pad PD2, and third short ring line SR3 is connected to the third pad PD3. Before the first side E1 is cut, the short ring lines SR1 to SR3 are connected to each other to discharge static electricity produced in the manufacturing process, and to prevent electrostatic destruction of the display panel PNL.

The first short ring line SR1, second short ring line SR2, and short ring line SR3 extend to the first side E1 of the display panel PNL.

The inorganic film IL includes cut portions CP11 to CP14 and extension portions EP11 to EP13. The extension portion EP11 is positioned between the cut portions CP11 and CP12, extension portion EP12 is positioned between the cut portions CP12 and CP13, and extension portion EP13 is positioned between the cut portions CP13 and CP14. The extension portion EP11 overlaps the first short ring line SR1, extension portion EP12 overlaps the second short ring line SR2, and extension portion EP13 overlaps the first short ring line SR3. That is, the first short ring line SR1, second short ring line SR2, and third short ring line WR3 are covered with the inorganic film IL to avoid exposure.

The residue RD is formed in the cut portions CP11 to CP14. That is, the residue RD resides between the first connection line WR11 and the second connection line WR12, and between the second connection line WR12 and the third connection line WR12. Thus, the first connection line WR11 and the second connection line WR12 may become conductive, and the second connection line WR12 and the third connection line WR13 may become conductive.

Figure 7:
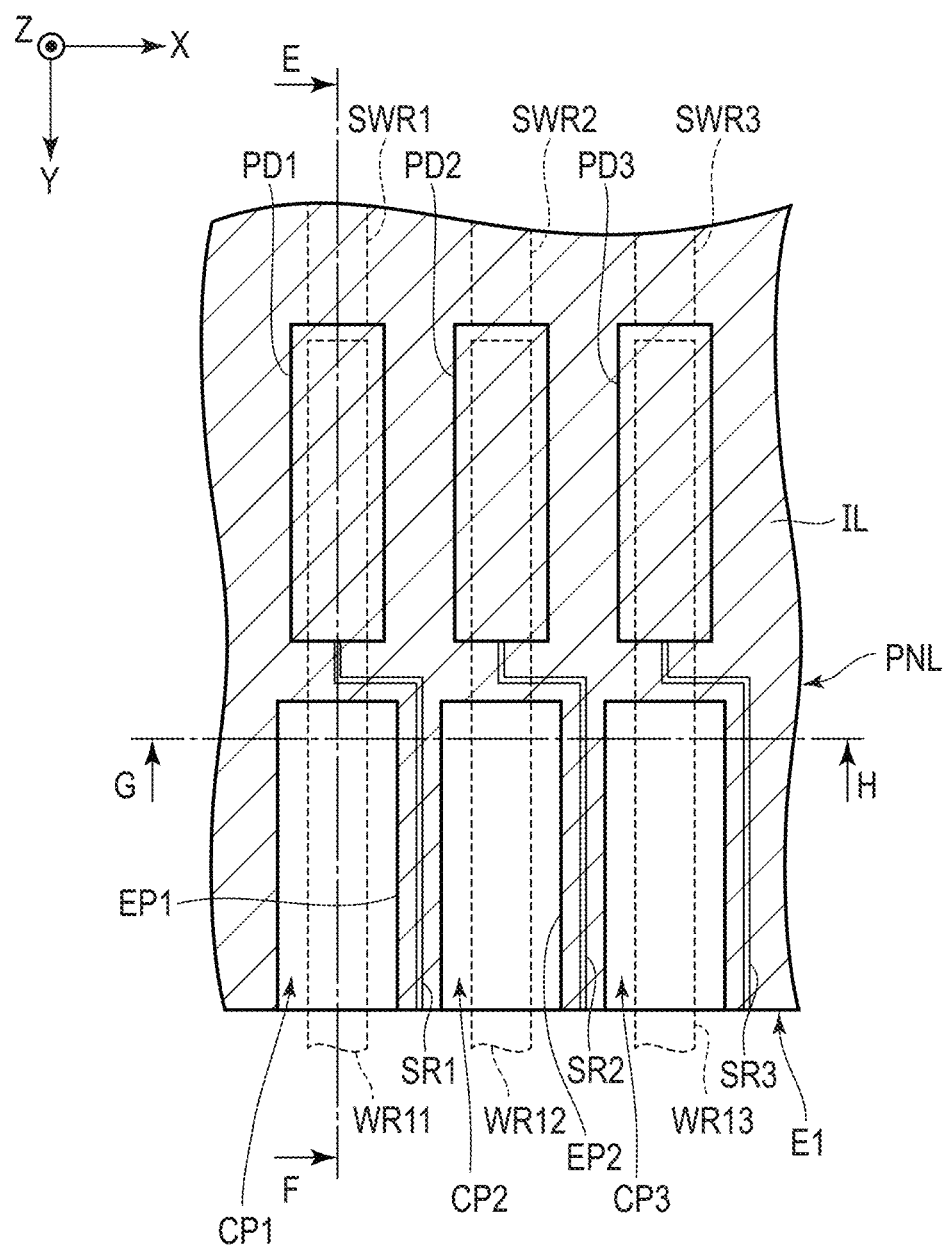
FIG. 7 is a plan view illustrating the variation of the embodiment.

FIG. 7 is a pan view of a variation of the embodiment. In the structure of FIG. 7, the display panel PNL includes a first short ring line SR1, second short ring line SR2, and third short ring line SR3 as compared to the structure of FIG. 2.

The first short ring line SR1 extends to the first side E1 between the first cut portion CP1 and the second cut portion CP2 and is covered with the first extension portion EP1. The second short ring line SR2 extends to the first side E1 between the second cut portion CP2 and the third cut portion CP3 and is covered with the second extension portion EP2. The third short ring line SR3 is covered with the inorganic film IL. Thus, as the first short ring line SR1, second short ring line SR2, and third short ring line SR3 are arranged corresponding to the shape of the inorganic film IL, the first short ring line SR1, second short ring line SR2, and third short ring line SR3 can be covered with the inorganic film IL while the above advantages can be maintained.

Figure 8:
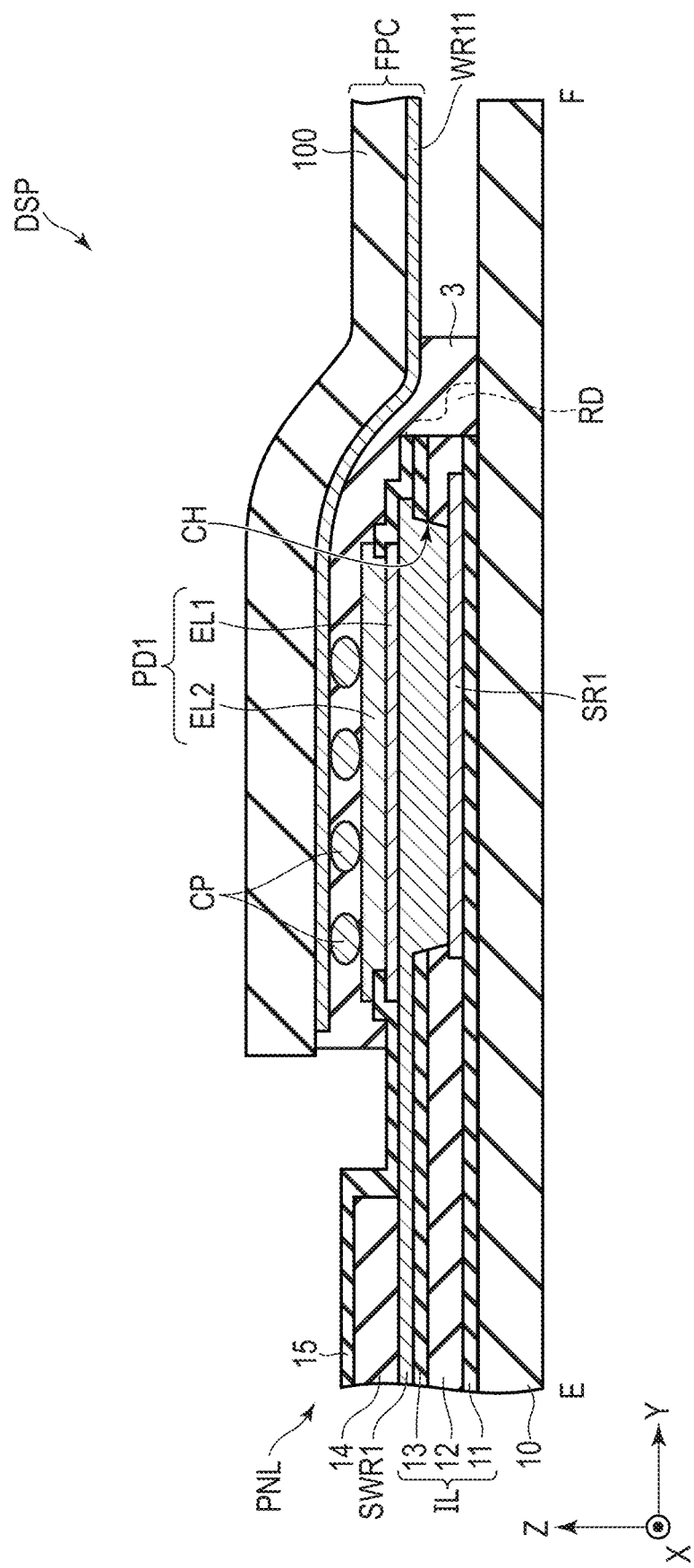
FIG. 8 is a cross-sectional view of the display panel, taken along line E-F of FIG. 7.

FIG. 8 is a cross-sectional view of the display panel PNL, taken along line E-F of FIG. 7.

The short ring line SR1 is positioned between the insulating film 11 and the insulating film 12. The first short ring line SR1 is formed of polysilicon, for example. If the display device DSP is a liquid crystal display device, the display panel PNL includes a semiconductor layer formed of polysilicon between the insulating film 11 and the insulating film 12, and the semiconductor layer and the first short ring line SR1 can be formed in the same forming process. Note that the first short ring line SR1 may be formed of a metal material. The signal line SWR1 is connected to the first short ring line SR1 via a contact hole CH formed in the insulating film 12 and the insulating film 13.

Figure 9:
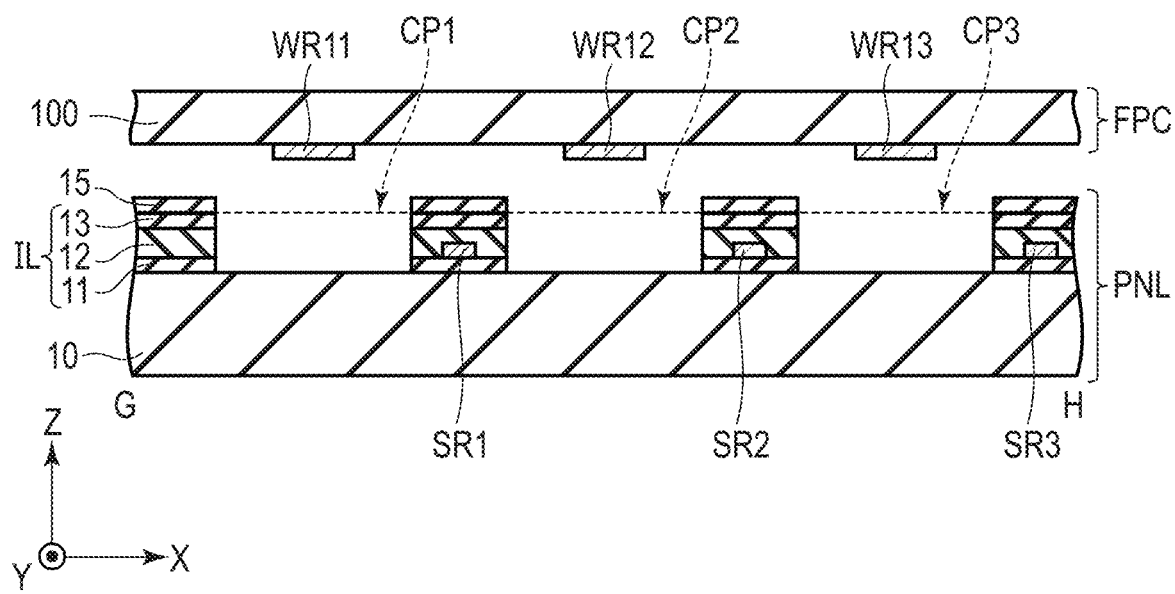
FIG. 9 is a cross-sectional view of the display panel, taken along line G-H of FIG. 7.

FIG. 9 is a cross-sectional view of the display panel PNL, taken along line G-H of FIG. 7.

The first short ring line SR1, second short ring line SR2, and third short ring line SR3 are arranged on the insulating film 11, and are covered with the insulating film 12.

The same advantages as above can be achieved in such a variation.

As explained above, with the embodiment, a semiconductor device which can reduce the decrease of production yield can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a panel including an insulating substrate, an inorganic film on the insulating substrate, and a first pad and a second pad positioned on the inorganic film; and
   a flexible printed circuit positioned on the panel and including a base substrate, a first connection line, and a second connection line, wherein
   a part of the flexible printed circuit overlaps the first pad and the second pad of the panel,
   the panel and the flexible printed circuit are adhered to each other via an anisotropic conductive film,
   the inorganic film includes a first cut portion overlapping the first connection line, a second cut portion overlapping the second connection line, and a first extension portion between the first cut portion and the second cut portion,
   the first cut portion, the second cut portion, and the first extension portion extend to a first end of the panel,
   the first connection line overlaps the first pad in plan view and is electrically connected to the first pad via the anisotropic conductive film, and
   the second connection line overlaps the second pad in plan view and is electrically connected to the second pad via the anisotropic conductive film.

2. The semiconductor device of claim 1, wherein
   the first pad and the second pad are arranged in a first direction,
   the first cut portion is arranged in a second direction which crosses the first direction of the first pad,
   the second cut portion is arranged in the second direction of the second pad, and
   the first cut portion and the second cut portion are arranged in the first direction.

3. The semiconductor device of claim 1, wherein
   the panel includes the first side and a second side extending in the first direction, and a third side and a fourth side extending in the second direction which crosses the first direction,
   the flexible printed circuit overlaps the first side, and
   an end of the inorganic film is located inside of the second side, the third side and the fourth side, in plan view.

4. The semiconductor device of claim 1, wherein
   the panel includes a short ring line connected to the first pad, and
   the short ring line extends to the first side between the first cut portion and the second cut portion, and is covered with the first extension portion of the inorganic film.

5. The semiconductor device of claim 4, wherein
   the short ring line is formed of polysilicon.

6. The semiconductor device of claim 1, wherein
   the first pad includes a first transparent electrode and a second transparent electrode disposed on the first transparent electrode.

7. The semiconductor device of claim 1, wherein
   the inorganic film includes a first insulating film and a second insulating film layered on the first insulating film.

8. The semiconductor device of claim 1, wherein
   the insulating substrate is a flexible substrate.

* * * * *